United States Patent
Oh et al.

(10) Patent No.: US 12,298,898 B2
(45) Date of Patent: May 13, 2025

(54) DYNAMIC NAND READ/WRITE ACCESS TIME FOR SSD RELIABILITY AND PERFORMANCE ENHANCEMENT

(71) Applicant: Dell Products L.P., Round Rock, TX (US)

(72) Inventors: Seung Min Oh, Singapore (SG); Chai Im Teoh, Singapore (SG); Young Hwan Jang, Gwangju-si (KR)

(73) Assignee: Dell & Products L.P., Round Rock, TX (US)

( * ) Notice: Subject to any disclaimer, the term of this patent is extended or adjusted under 35 U.S.C. 154(b) by 62 days.

(21) Appl. No.: 17/974,762

(22) Filed: Oct. 27, 2022

(65) Prior Publication Data

US 2024/0143499 A1    May 2, 2024

(51) Int. Cl.
*G06F 12/02* (2006.01)
*G11C 16/04* (2006.01)

(52) U.S. Cl.
CPC ...... *G06F 12/0246* (2013.01); *G11C 16/0483* (2013.01)

(58) Field of Classification Search
CPC .......................... G06F 12/0246; G11C 16/0483
See application file for complete search history.

(56) References Cited

U.S. PATENT DOCUMENTS

| | | | |
|---|---|---|---|
| 9,799,401 B2 | 10/2017 | Kim et al. | |
| 2018/0076829 A1* | 3/2018 | Ueki | G06F 11/073 |
| 2019/0244670 A1* | 8/2019 | Yeh | G11C 16/26 |
| 2019/0303039 A1* | 10/2019 | Teh | G06F 3/0604 |
| 2019/0348133 A1* | 11/2019 | Chen | G11C 11/5642 |
| 2020/0066354 A1* | 2/2020 | Ioannou | G11C 16/26 |
| 2020/0210831 A1* | 7/2020 | Zhang | G06N 3/08 |
| 2020/0257460 A1* | 8/2020 | Som | G06F 3/0673 |
| 2022/0310172 A1* | 9/2022 | O'Toole | G06F 11/10 |
| 2023/0060971 A1* | 3/2023 | You | G11C 29/025 |
| 2023/0085040 A1* | 3/2023 | Scholbrock | G06F 3/061 |
| | | | 711/154 |

\* cited by examiner

*Primary Examiner* — Tasnima Matin
(74) *Attorney, Agent, or Firm* — Larson Newman, LLP

(57) ABSTRACT

An information handling system includes a flash device interface and a flash device. The flash device includes a flash controller and a flash array. The flash device interface programs a command register of the flash controller with a first value, and reads a status register of the flash controller. The flash device interface further determines that a usage of the flash device is in accordance with one of a first usage model and a second usage model based upon a value in the first status register. When the usage is in accordance with the first usage mode, the flash device interface retains the first value in the command register. When the usage is in accordance with the second usage model, the flash device interface reprograms the command register with a second value. The command register controls a read threshold count value for reading data from the flash array.

20 Claims, 6 Drawing Sheets

DYNAMIC NAND READ/WRITE ACCESS TIME FOR SSD RELIABILITY AND PERFORMANCE ENHANCEMENT

FIELD OF THE DISCLOSURE

This disclosure generally relates to information handling systems, and more particularly relates to providing dynamic NAND read/write access time for SSD reliability and performance enhancement in an information handling system.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

An information handling system may include a flash device interface and a flash device. The flash device includes a flash controller and a flash array. The flash device interface may program a command register of the flash controller with a first value, and read a status register of the flash controller. The flash device interface may further determine that a usage of the flash device is in accordance with one of a first usage model and a second usage model based upon a value in the status register. When the usage is in accordance with the first usage mode, the flash device interface may retain the first value in the command register. When the usage is in accordance with the second usage model, the flash device interface may reprogram the command register with a second value. The command register may control a read threshold count value for reading data from the flash array.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
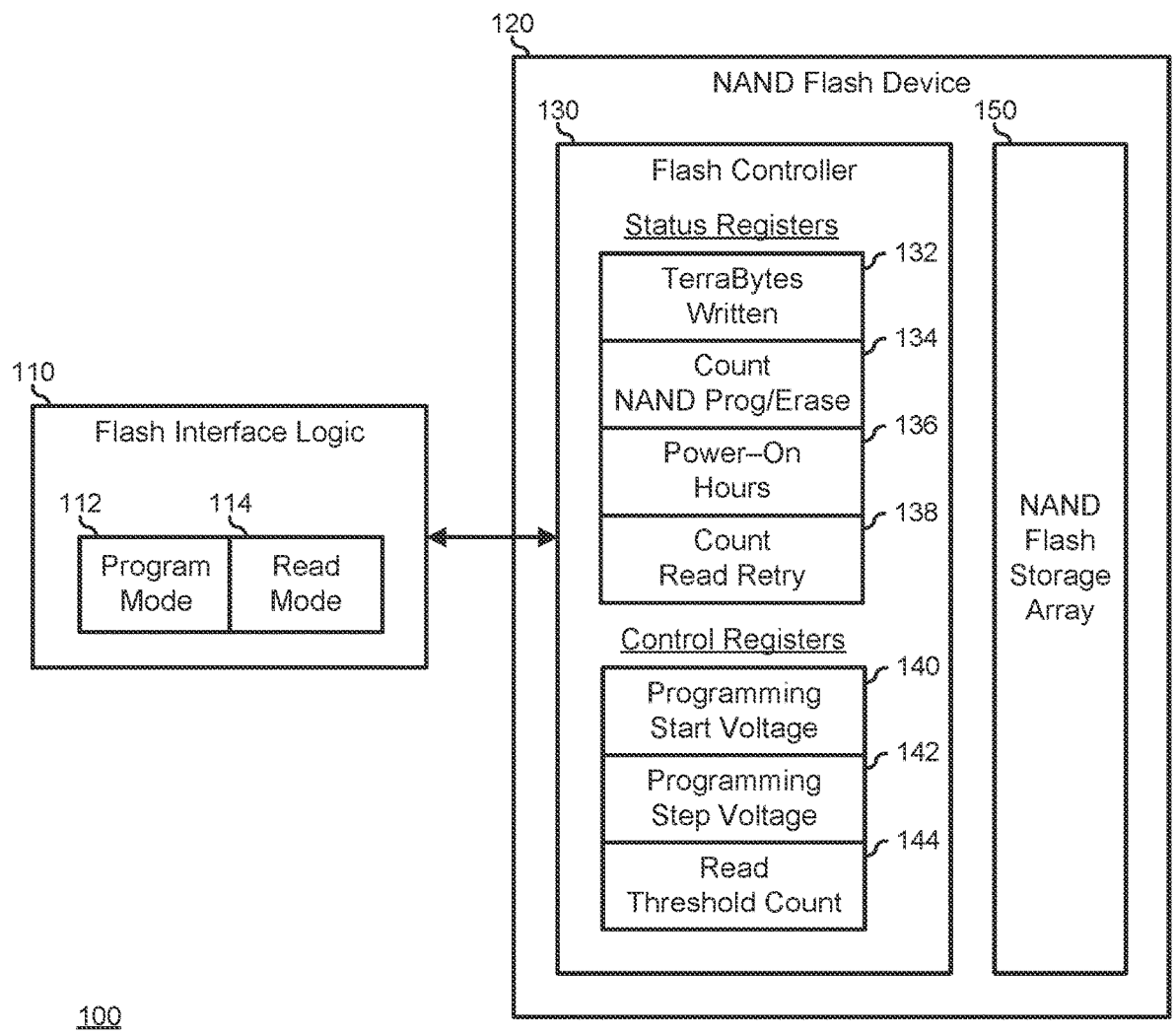
FIG. 1 is a block diagram illustrating an information handling system according to an embodiment of the current disclosure.

FIG. 1 illustrates an information handling system 100 including a flash interface logic 110 and a NAND flash device 120. Information handling system 100 will be understood to include other elements, such as the elements of information handling system 700 as described below. SSD interface logic 110 represents a hardware device, a software program, utility, or driver, SSD firmware code, or a combination thereof that is configured to receive data transactions from a host processing system of information handling system 100 (not illustrated), and to execute the data transactions on NAND flash device 120. NAND flash device 120 represents a memory storage device based upon a NAND flash storage array 150. NAND flash device 120 may represent a solid state drive (SSD) device, an embedded device, or the like.

In particular, flash interface logic 110 may receive data write transactions, data read transactions, status request transactions, setup and control transactions, or the like. In response to a data write transaction, flash interface logic 110 directs NAND flash device 120 to receive an incoming data block and to store the data within a NAND flash storage array 150 of the NAND flash device. A flash controller 130 of flash storage array 140 operates to receive a block address along with the data block, and to select a physical block within NAND flash storage array within which to store the data block. In response to a data read transaction, flash interface logic 110 directs NAND flash device 120 to retrieve a requested data block and to store the data within a from NAND flash storage array 150. Flash controller 130 determines the physical block within NAND flash storage array that stores the requested block, and sends the data block to SSD interface logic 110.

In response to a status request transaction, flash interface logic 110 requests information from one or more status register of flash controller 130, including a terra bytes written (TBW) register 132, a flash program/erase (PE) count register 134, a power-on hours register 136, and a read retry (RR) count register 138. One or more of registers 132, 134, 136, and 138 may be implemented within flash interface logic 110, as needed or desired. In particular, some status information may be more readily determined within flash interface logic 110, such as a TBW count, and a power-on hours count. On the other hand, other status information may be more readily determine within flash controller 130, particularly where the status information may relate to block level information within NAND flash storage array 150, such as a block level PE count or a RR count. In response to a control transaction, flash interface logic 110 provides control information to one or more control register of flash controller 130, including a programming start voltage register 140, a programming step voltage register 142, and a read threshold count register 144.

TBW register 132 accumulates a total amount of data writes issued to NAND flash device 120. PE count register 134 accumulates a total number of program (write) operations and erase (re-write) operations performed by NAND flash device 120. In a particular embodiment, PE count register 134 represents one or more similar registers, each associated with a particular block within NAND flash storage array 150. Power-on hours register 136 accumulates a total number of hours that NAND flash device 120 has been powered on. RR count register 138 accumulates a total number of block read retries that are performed on NAND storage array 150. In a particular embodiment, RR count register 138 represents one or more similar registers, each associated with a particular block within NAND flash storage array 150. It will be understood that SSD controller 130 may include other status registers, as needed or desired.

Programming start voltage register 140, and programming step voltage register 142 will be described further below with regard to FIG. 2 and FIG. 3. Flash interface logic 110 includes a program mode register 112 which will be described further below with regard to FIG. 2 and FIG. 3. Read threshold count register 144 will be described further below with regard to FIG. 4 and FIG. 5. Flash interface logic 110 includes a read mode register 114 which will be described further below with regard to FIG. 4 and FIG. 5. The details of executing data transactions on NAND SSD devices are known in the art and will not be further described herein, except as may be needed to illustrate the current embodiments.

The performance of NAND flash device 120 is determined by various characteristics, such as the programming time ($t_{PROG}$) and the read time ($t_R$). However, it will be understood that the programming time ($t_{PROG}$) has a much greater impact on the performance of the NAND flash device, because the programming time ($t_{PROG}$) is typically 10-20 times longer than the read time ($t_R$). In a particular embodiment, the programming time ($t_{PROG}$) and the read time ($t_R$) are adjustable. In particular, NAND flash device 120 may further operate with a longer programming time ($t_{PROG}$) in order to achieve higher reliability by slowing damage to the NAND cells of NAND flash storage array 150, thereby achieving a lower read bit error rate (BER). However, operating with the longer programming time ($t_{PROG}$) may result in faster degradation of the NAND cells. Thus, a design tradeoff must be achieved between read reliability and device longevity. Moreover, NAND flash device 120 may operate with a shorter programming time ($t_{PROG}$) to achieve higher performance and greater longevity, at the expense of read reliability. To counter the read reliability associated with the shorter programming time ($t_{PROG}$), NAND flash device 120 may achieve a higher read reliability by operating with a longer read time ($t_R$) that implements a higher read accuracy sensing mechanism, or the NAND flash device may operate with a shorter read time ($t_R$) to achieve higher performance.

It has been understood by the inventors of the current disclosure that the typical NAND flash device is operated with a fixed programming time ($t_{PROG}$) and a fixed read time ($t_R$). In particular, the programming time ($t_{PROG}$) and the read time ($t_R$) are typically selected to meet a high reliability standard. Thus the longer programming time ($t_{PROG}$) and the longer read time ($t_R$) may typically be selected in order to meet a system manufacturer's TBW and BER requirements. However, it has been further understood that all data uses do not necessitate the higher reliability and longevity usage model, and thus higher performance settings may be more desirable. For example, when NAND flash device 120 is used in an intensive read/write environment, such as where the data stored on NAND flash storage array 150 represents database data, intermediate tier data in a tiered data storage utility, or the like, and when risk of data loss is more unacceptable, the high reliability settings for programming time ($t_{PROG}$) and the read time ($t_R$) may be more desirable. On the other hand, when NAND flash device 120 is used in a less intensive read/write environment, such as where the data stored on NAND flash storage array 150 represents media data or the like, and when risk of data loss is more acceptable, the high performance settings for programming time ($t_{PROG}$) and the read time ($t_R$) may be more desirable. However, because the settings for programming time ($t_{PROG}$) and the read time ($t_R$) are typically chosen for high reliability, the potential performance gain for less write intensive usage models are not realizable.

Figure 2:
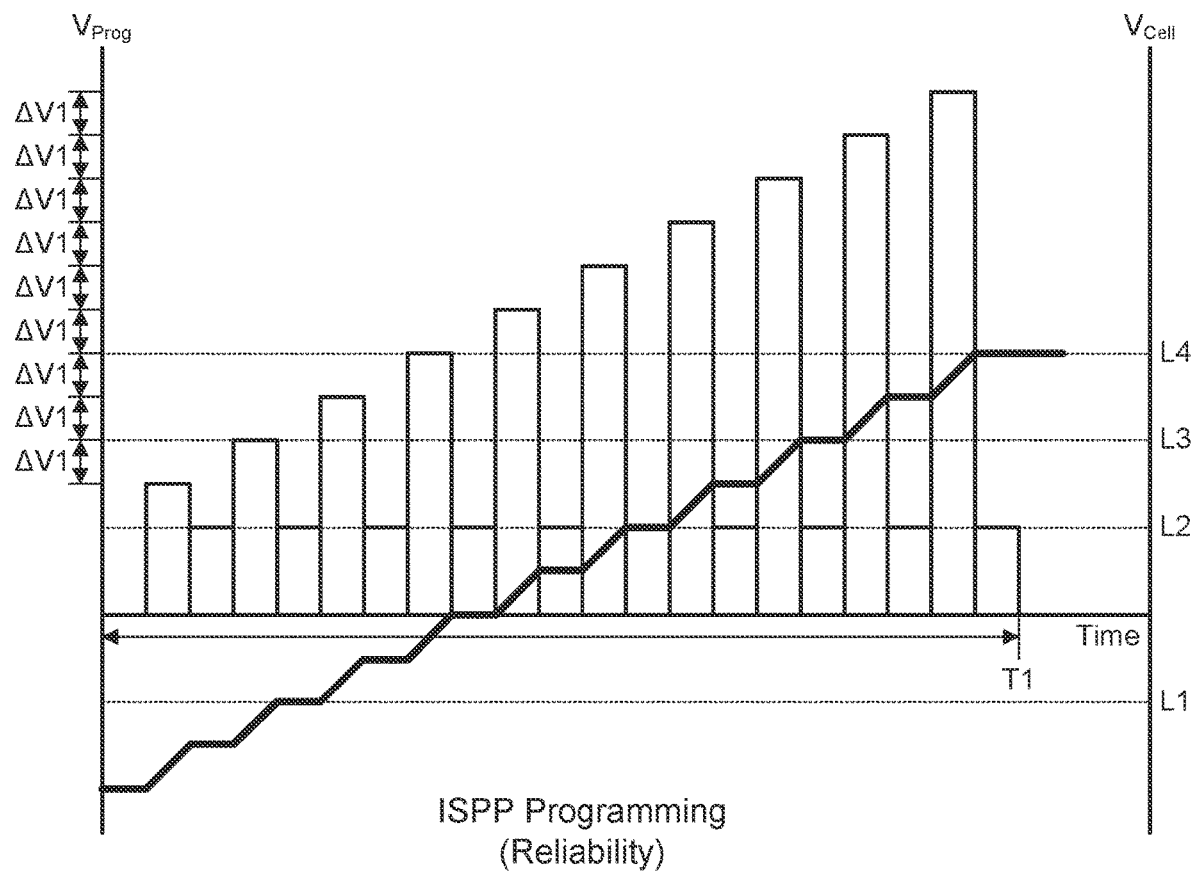
FIG. 2 illustrates an incremental step pulse programming (ISPP) operation for reliability for a solid state drive (SSD) in the information handling system of FIG. 1.
Figure 2:
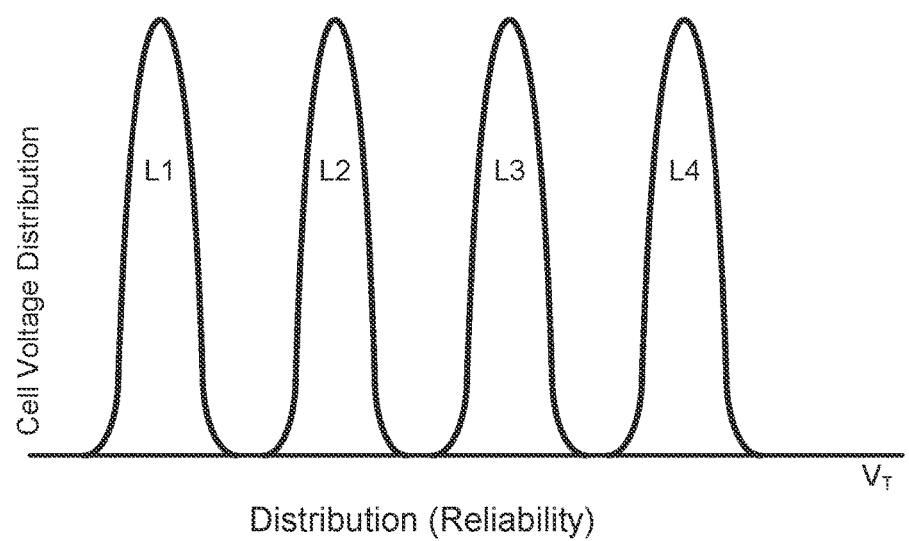
Figure 3:
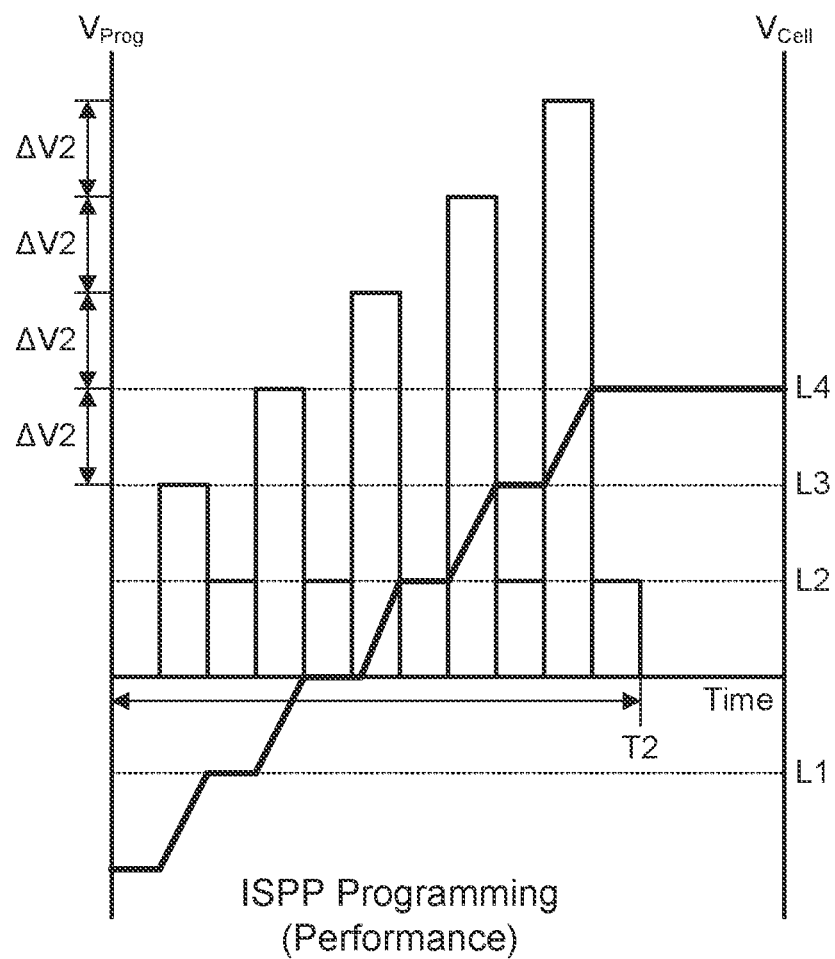
FIG. 3 illustrates an ISPP operation for performance for the SSD in the information handling system of FIG. 1.
Figure 3:
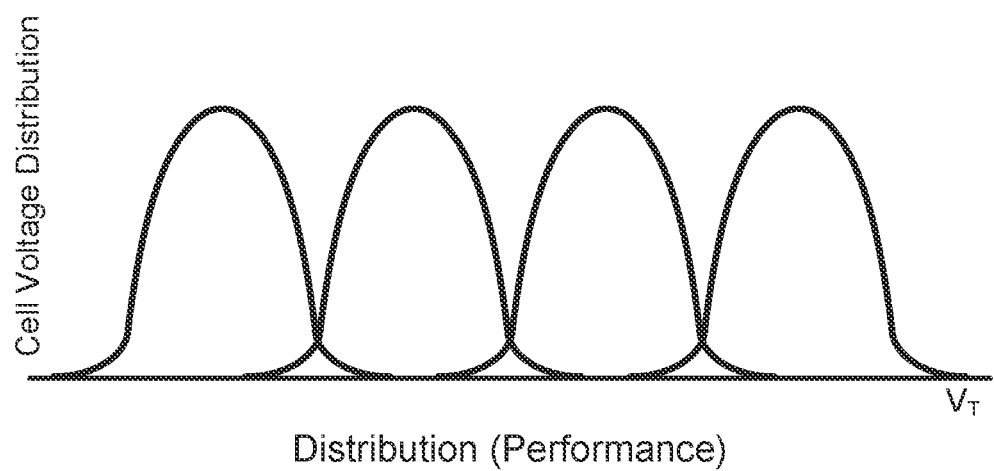

FIG. 2 illustrates an incremental step pulse programming (ISPP) operation for reliability for a NAND flash device similar to NAND flash device 120, and FIG. 3 illustrates an ISPP operation for performance NAND flash device. It will be understood that, in providing an ISPP operation, the cells of a block of data are programmed utilizing a succession of increasing programming voltages (Vprog), each successive programming voltage (Vprog) being greater than the prior voltage by a delta voltage (ΔV). It will be further understood that, by having a lower starting programming voltage (Vprog) and a smaller delta voltage (ΔV1), as shown in the top graph of FIG. 2, the cell voltage distribution for the desired cell detection states (L1, L2, L3, and L4), as shown in the bottom graph of FIG. 2, have a high peak voltage, and a narrow threshold voltage (VT) distribution. In this case, the programming of the cells of the NAND flash device is provided for high reliability, but will take a long programming time (T1). On the other hand, by having a higher starting programming voltage (Vprog) and a larger delta voltage (ΔV2), as shown in the top graph of FIG. 3, the cell voltage distribution for the desired cell detection states (L1, L2, L3, and L4), as shown in the bottom graph of FIG. 3, have a lower peak voltage, and a wider threshold voltage (VT) distribution. In this case, the programming of the cells of the NAND flash device is provided for high performance because the programming time (T2) is shorter. The details of ISPP operations are known in the art and will not be further described herein, except as may be needed to illustrate the current embodiments.

Figure 4:
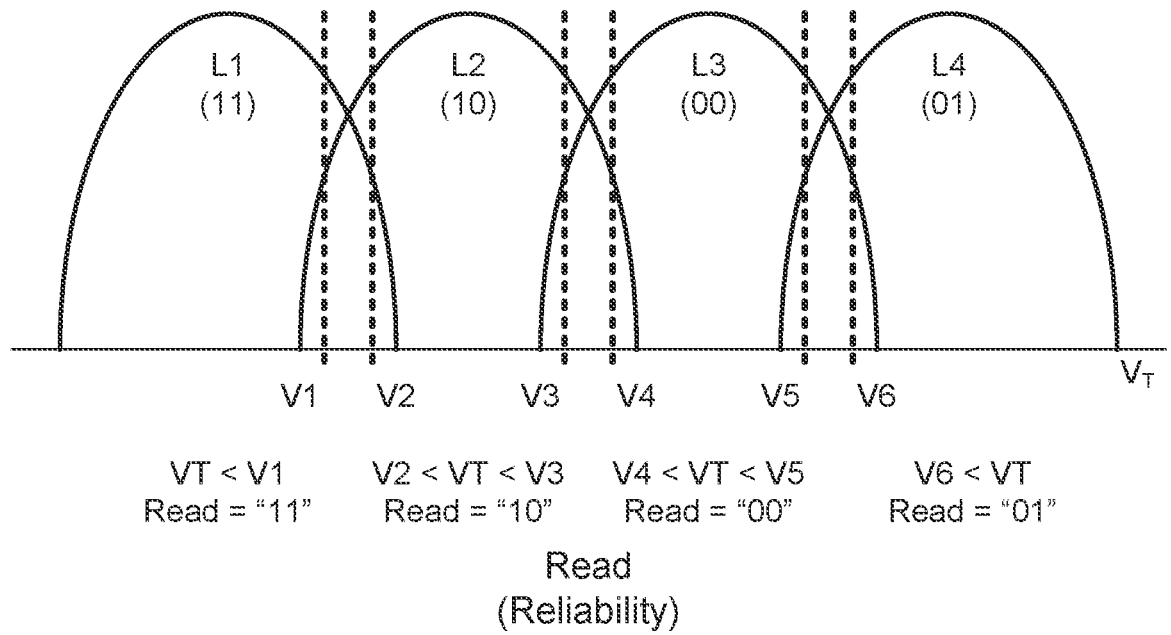
FIG. 4 illustrates a read operation for reliability for the SSD in the information handling system of FIG. 1.
Figure 5:
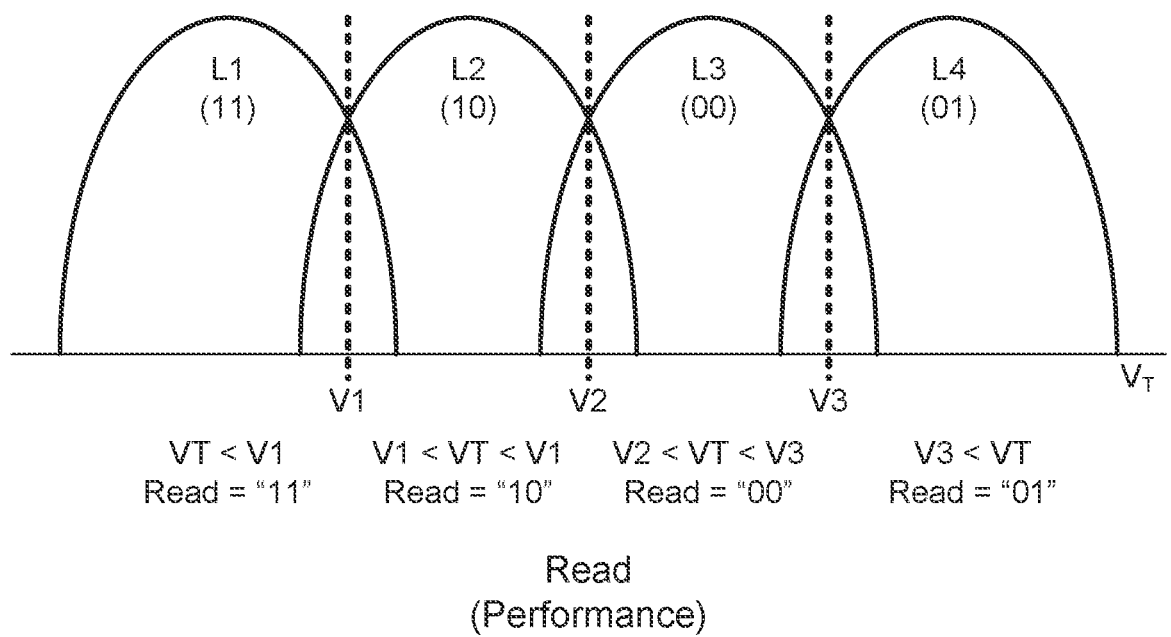
FIG. 5 illustrates a read operation for performance for the SSD in the information handling system of FIG. 1.

FIG. 4 illustrates a read operation for reliability for a NAND flash device similar to NAND flash device 120, and FIG. 5 illustrates a read operation for performance NAND flash device. The voltage distribution for the desired detection states (L1, L2, L3, and L4) may overlap each other at the edges of the detection states, creating a potential for misreading of the data stored in one or more cell of the NAND flash device. In FIG. 4, a high reliability read operation is achieved by performing a sequence of detections and comparisons of the detected threshold voltage (VT). In particular, each state transition is demarked by two detection voltages. In particular, the L1 state is demarked on the high voltage side by a detection threshold V1, the L2 state is demarked on the low voltage side by a detection voltage V2 and on the high voltage side by a detection voltage V3, the L3 state is demarked on the low voltage side by a detection voltage V4 and on the high voltage side by a detection voltage V5, and the L4 state is demarked on the low voltage side by a detection voltage V6. Thus the high reliability read operation is characterized by a set of inequalities as follows:

$L1$ is detected when: $VT<V1$;

$L2$ is detected when: $V2<VT<V3$;

$L3$ is detected when: $V4<VT<V5$; and $L4$ is detected when: $V6<VT$.

The detection with reference to six (6) voltage threshold levels (V1, V2, V3, V4, V5, and V6) takes a longer time than the high performance read as described below. The reliability of the high reliability operation may be dependent upon the voltage margins between threshold voltage pairs V1-V2, V3-V4, and V5-V6.

In FIG. 5, a high performance read operation is achieved by performing a different sequence of detections and comparisons of the detected threshold voltage (VT). In particular, each state transition is demarked by one detection voltages. In particular, the L1 state is demarked on the high voltage side by a detection threshold V1, the L2 state is demarked on the low voltage side by the detection voltage V1 and on the high voltage side by a detection voltage V2, the L3 state is demarked on the low voltage side by the detection voltage V2 and on the high voltage side by a detection voltage V3, and the L4 state is demarked on the low voltage side by the detection voltage V4. Thus the high reliability read operation is characterized by a set of inequalities as follows:

$L1$ is detected when: $VT<V1$;

$L2$ is detected when: $V1<VT<V2$;

$L3$ is detected when: $V2<VT<V3$; and $L4$ is detected when: $V3<VT$.

The detection with reference to three (3) voltage threshold levels (V1, V2, and V3) takes a shorter time than the high reliability read as described.

Returning to FIG. 1, flash interface logic 110 operates to monitor the status information provided in TBW register 132, PE count register 134, power-on hour register 136, and RR count register 138, and to determine a usage model to which NAND flash device 120 is being utilized. Then, based upon the determined usage model, flash interface logic 110 determines a program mode 112 and a read mode 114, and writes information related to the program mode to programming start voltage register 140 and programming step voltage register 142, and information related to the read mode to read threshold count register 144. In particular, when the information from the status registers indicates that the usage model for NAND flash device 120 favors higher reliability operation, flash interface logic 110 sets program mode 112 and 114 to a reliability mode.

In response, flash interface logic 110 sets programming start voltage register 140 and programming step voltage register 142 to provide ISPP operation in accordance with FIG. 2, and sets read threshold count register 144 to provide six (6) threshold levels for read operations in accordance with FIG. 4. On the other hand, when the information from the status registers indicates that the usage model for NAND flash device 120 favors higher performance operation, flash interface logic 110 sets program mode 112 and 114 to a performance mode. In response, flash interface logic 110 sets programming start voltage register 140 and programming step voltage register 142 to provide ISPP operation in accordance with FIG. 3, and sets read threshold count register 144 to provide three (3) threshold levels for read operations in accordance with FIG. 4.

In a particular embodiment, flash interface logic 110 operates to read the status registers on a periodic basis, such as once every 10 hours, once per day, once per week, or the like, and readjusts program mode 112 and read mode 114 accordingly. In this way, the operation of NAND flash device 120 is monitored and maintained in an optimum operating mode based upon shifting usage patterns of information handling system 100. In a variation of the above embodiment, flash interface logic 110 operates to read the status registers periodically, but does not modify the operational state of NAND flash device 120 until a particular milestone is reached. For example, flash interface logic 110 may read the status registers daily, but may only adjust program mode 112 and read mode 114 weekly. In another case, the milestone may relate to the TBW information. For example, flash interface logic 110 may refrain from modifying the operational state of NAND flash device 120 until TBW register 132 indicates that over 0.5 TB of data have been written to the NAND flash device.

The programming operations as depicted in FIG. 2 and FIG. 3 are typical, and as such may be understood to be highly stylized. As such, the number of program steps, shown in FIG. 2 as 10 steps, and shown in FIG. 3 as five (5) steps, may be representative of any number of steps and voltage deltas, as may be needed or desired. For example, more or less than 10 steps may be utilized in a reliability mode of ISPP programming, and more or less than five (5) steps may be utilized in a performance mode of ISPP programming. As described herein, a reliability mode of programming and a performance mode of programming are illustrated, but additional modes of programming that provide intermediate levels of reliability and performance may be utilized as needed or desired. For example, three or more operating modes may be implemented by a flash interface logic, as needed or desired. As illustrated, NAND flash devices described herein represent two-level cell technology. However, the teachings herein may likewise be utilized in the context of three-level cell (TLC) technology NAND flash devices, four-level cell (QLC) technology NAND flash devices, or higher level technologies, as needed or desired.

Figure 6:
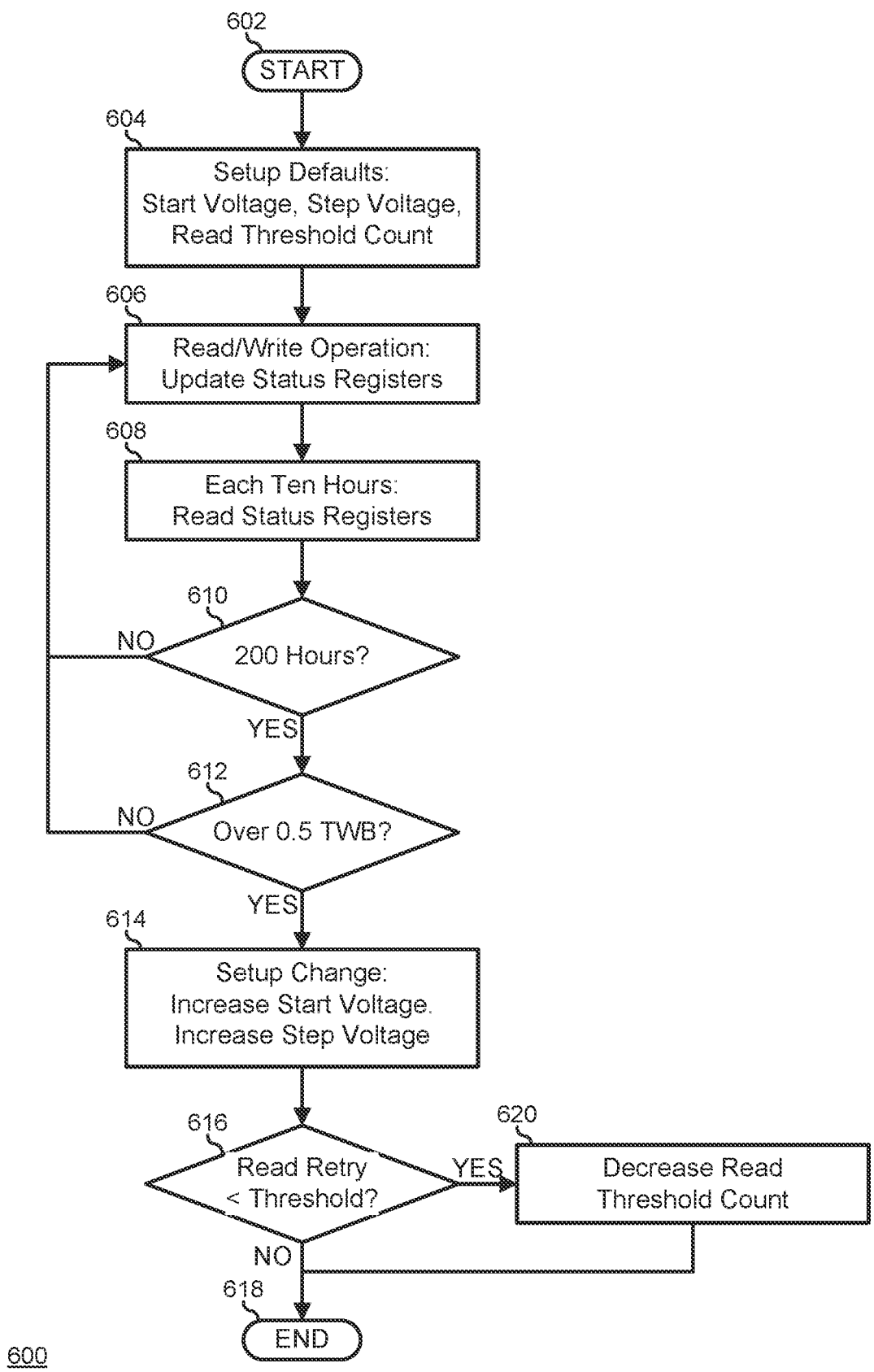
FIG. 6 is a flowchart illustrating a method for providing dynamic NAND read/write access time for SSD reliability and performance enhancement in an information handling system according to an embodiment of the current disclosure.

FIG. 6 illustrates a method 600 for providing dynamic NAND read/write access time for NAND flash device reliability and performance enhancement in an information handling system, starting at block 602. An information handling system sets up the operating conditions for a NAND flash device, including setting the programming start voltage, the programming step voltage, and the read threshold count registers in block 604. The operating conditions are set for high reliability operation. Read/write transactions are performed on the NAND flash device and the status registers are updated based upon the read/write transactions in block 606. A flash interface logic reads periodically reads the status registers in block 608. For example the flash interface logic may read the status registers every 10 hours. A decision is made as to whether or not 200 hours of operation for the NAND flash device have elapsed in decision block 610. If not, the "NO" branch of decision block 610 is taken and the method returns to block 606 where read/write transactions and status register updates are continued.

When 200 hours of operation for the NAND flash device have elapsed, the "YES" branch of decision block 610 is taken and a decision is made as to whether or not the TBW register indicates that 0.5 TB of data have been written to the NAND flash device in decision block 612. If not, the "NO" branch of decision block 612 is taken and the method returns to block 606 where read/write transactions and status register updates are continued. When 0.5 TB of data have been written to the NAND flash device, the "YES" branch of decision block 612 is taken and the setup of the NAND flash device is changed to increase the programming start voltage and to increase the programming step voltage to operate the NAND flash device in the high performance mode in block 614. A decision is made as to whether or not the RR register of the NAND flash device is less than a particular threshold in decision block 616. If not, the "NO" branch of decision block 616 is taken and the method ends in block 618. If the RR register of the NAND flash device is less than the threshold, the "YES" branch of decision block 616 is taken, the read threshold count is decreased in block 620, placing the read operations in the performance mode, and the method ends in block 618.

Note that, in furtherance to method 600, additional or different checkpoints may be utilized, as needed or desired. For example, in method 600, checkpoints at 200 hours of operation and 0.5 TBW are utilized for monitoring, managing, and maintaining the programming start voltage and the programming step voltage. Other exemplary checkpoints may include 400 hours of operation and 1.0 TBW, 600 hours of operation and 1.5 TBW, or other numbers of hours of operation and TBW, as needed or desired. Also, one or more checkpoint may be utilized as needed or desired. For example, a method similar to method 600 may provide for the monitoring, managing, and maintaining of the programming start voltage and the programming step voltage at a first checkpoint, such as at 200 hours of operation and 0.5 TBW, at a second checkpoint, such as at 400 hours of operation and 1.0 TBW, and at a third checkpoint, such as at 600 hours of operation and 1.5 TBW, as needed or desired.

Figure 7:
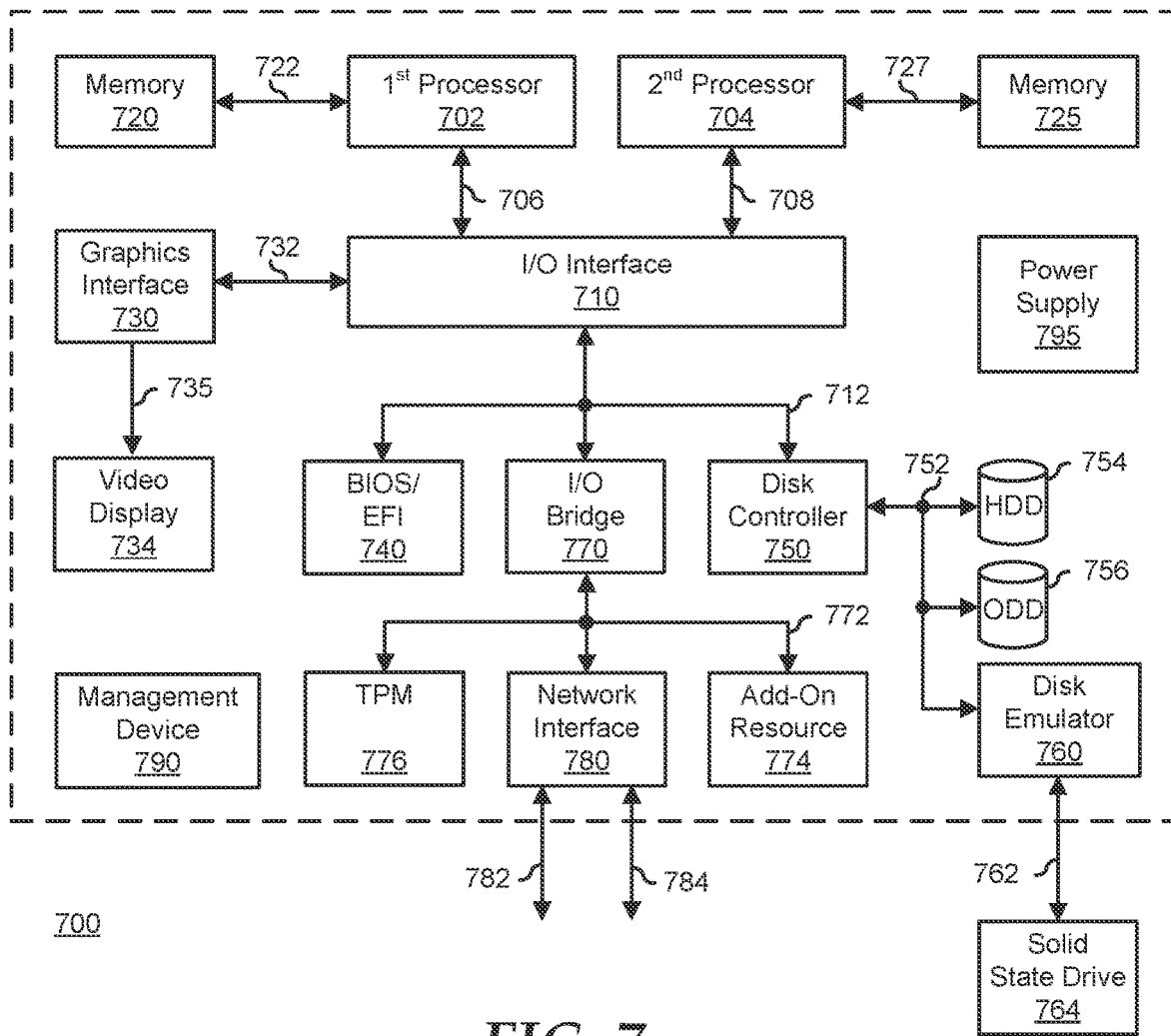
FIG. 7 is a block diagram illustrating a generalized information handling system according to another embodiment of the present disclosure.

FIG. 7 illustrates a generalized embodiment of an information handling system 700. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 700 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 700 can include processing resources for executing machine-executable code, such as a central processing unit (CPU), a programmable logic array (PLA), an embedded device such as a System-on-a-Chip (SoC), or other control logic hardware. Information handling system 700 can also include one or more computer-readable medium for storing machine-executable code, such as software or data. Additional components of information handling system 700 can include one or more storage devices that can store machine-executable code, one or more communications ports for communicating with external devices, and various input and output (I/O) devices, such as a keyboard, a mouse, and a video display. Information handling system 700 can also include one or more buses operable to transmit information between the various hardware components.

Information handling system 700 can include devices or modules that embody one or more of the devices or modules described below, and operates to perform one or more of the methods described below. Information handling system 700 includes processors 702 and 704, an input/output (I/O) interface 710, memories 720 and 725, a graphics interface 730, a basic input and output system/universal extensible firmware interface (BIOS/UEFI) module 740, a disk controller 750, a hard disk drive (HDD) 754, an optical disk drive (ODD) 756, a disk emulator 760 connected to an external solid state drive (SSD) 762, an I/O bridge 770, one or more add-on resources 774, a trusted platform module (TPM) 776, a network interface 780, a management device 790, and a power supply 795. Processors 702 and 704, I/O interface 710, memory 720 and 725, graphics interface 730, BIOS/UEFI module 740, disk controller 750, HDD 754, ODD 756, disk emulator 760, SSD 762, I/O bridge 770, add-on resources 774, TPM 776, and network interface 780 operate together to provide a host environment of information handling system 700 that operates to provide the data processing functionality of the information handling system. The host environment operates to execute machine-executable code, including platform BIOS/UEFI code, device firmware, operating system code, applications, programs, and the like, to perform the data processing tasks associated with information handling system 700.

In the host environment, processor 702 is connected to I/O interface 710 via processor interface 706, and processor 704 is connected to the I/O interface via processor interface 708. Memory 720 is connected to processor 702 via a memory interface 722. Memory 725 is connected to processor 704 via a memory interface 727. Graphics interface 730 is connected to I/O interface 710 via a graphics interface 732, and provides a video display output 735 to a video display 734. In a particular embodiment, information handling system 700 includes separate memories that are dedicated to each of processors 702 and 704 via separate memory interfaces. An example of memories 720 and 725 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 740, disk controller 750, and I/O bridge 770 are connected to I/O interface 710 via an I/O channel 712. An example of I/O channel 712 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 710 can also include one or more other I/O interfaces, including an Industry Standard Architecture (ISA) interface, a Small Computer Serial Interface (SCSI)

interface, an Inter-Integrated Circuit (I²C) interface, a System Packet Interface (SPI), a Universal Serial Bus (USB), another interface, or a combination thereof. BIOS/UEFI module 740 includes BIOS/UEFI code operable to detect resources within information handling system 700, to provide drivers for the resources, initialize the resources, and access the resources. BIOS/UEFI module 740 includes code that operates to detect resources within information handling system 700, to provide drivers for the resources, to initialize the resources, and to access the resources.

Disk controller 750 includes a disk interface 752 that connects the disk controller to HDD 754, to ODD 756, and to disk emulator 760. An example of disk interface 752 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 760 permits SSD 764 to be connected to information handling system 700 via an external interface 762. An example of external interface 762 includes a USB interface, an IEEE 1394 (Firewire) interface, a proprietary interface, or a combination thereof. Alternatively, solid-state drive 764 can be disposed within information handling system 700.

I/O bridge 770 includes a peripheral interface 772 that connects the I/O bridge to add-on resource 774, to TPM 776, and to network interface 780. Peripheral interface 772 can be the same type of interface as I/O channel 712, or can be a different type of interface. As such, I/O bridge 770 extends the capacity of I/O channel 712 when peripheral interface 772 and the I/O channel are of the same type, and the I/O bridge translates information from a format suitable to the I/O channel to a format suitable to the peripheral channel 772 when they are of a different type. Add-on resource 774 can include a data storage system, an additional graphics interface, a network interface card (NIC), a sound/video processing card, another add-on resource, or a combination thereof. Add-on resource 774 can be on a main circuit board, on a separate circuit board or add-in card disposed within information handling system 700, a device that is external to the information handling system, or a combination thereof.

Network interface 780 represents a NIC disposed within information handling system 700, on a main circuit board of the information handling system, integrated onto another component such as I/O interface 710, in another suitable location, or a combination thereof. Network interface device 780 includes network channels 782 and 784 that provide interfaces to devices that are external to information handling system 700. In a particular embodiment, network channels 782 and 784 are of a different type than peripheral channel 772 and network interface 780 translates information from a format suitable to the peripheral channel to a format suitable to external devices. An example of network channels 782 and 784 includes InfiniBand channels, Fibre Channel channels, Gigabit Ethernet channels, proprietary channel architectures, or a combination thereof. Network channels 782 and 784 can be connected to external network resources (not illustrated). The network resource can include another information handling system, a data storage system, another network, a grid management system, another suitable resource, or a combination thereof.

Management device 790 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 700. In particular, management device 790 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 700, such as system cooling fans and power supplies. Management device 790 can include a network connection to an external management system, and the management device can communicate with the management system to report status information for information handling system 700, to receive BIOS/UEFI or system firmware updates, or to perform other task for managing and controlling the operation of information handling system 700. Management device 790 can operate off of a separate power plane from the components of the host environment so that the management device receives power to manage information handling system 700 when the information handling system is otherwise shut down. An example of management device 790 includes a commercially available BMC product or other device that operates in accordance with an Intelligent Platform Management Initiative (IPMI) specification, a Web Services Management (WS-Man) interface, a Redfish Application Programming Interface (API), another Distributed Management Task Force (DMTF), or other management standard, and can include an Integrated Dell Remote Access Controller (iDRAC), an Embedded Controller (EC), or the like. Management device 790 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system, comprising:
a flash device interface; and
a flash device including a flash controller and a flash array;
wherein the flash device interface 1) programs a first command register of the flash controller with a first value, 2) reads a first status register of the flash controller, 3) determines that a usage of the flash device is in accordance with one of a more read/write-intensive usage and a less read/write-intensive usage based upon a value in the first status register, 4) sets a mode register of the flash device interface to a first state and retains the first value in the first command register when the usage is in accordance with the more read/write-intensive usage, and 5) sets the mode register to a second state and reprograms the first command register with a second value when the usage is in accordance with the less read/write-intensive usage, wherein the first command register controls a read threshold count value for reading data from the flash array, wherein the read threshold count value is associated with a number of voltage threshold levels provided for read operations of the flash controller.

2. The information handling system of claim 1, wherein in further response to reading the first status register, the flash device interface determines if a status value stored in the first status register is less than a threshold.

3. The information handling system of claim 2, wherein the first status register indicates a number of read retries to the flash array.

4. The information handling system of claim 3, wherein, when the number of read retries is less than the threshold, the second value is less than the first value.

5. The information handling system of claim 3, wherein, when the number of read retries is not less than the threshold, the second value is greater than the first value.

6. The information handling system of claim 1, wherein the first value is associated with higher reliability data reads from the flash array than the second value, and the second value is associated with higher performance data reads from the flash array than the first value.

7. The information handling system of claim 1, wherein further the flash device interface programs a second command register of the flash controller with a third value, reads a second status register of the flash controller, and in response to reading the second status register, programs the second command register with a fourth value, wherein the second command register controls a programming value for programming data into the flash array.

8. The information handling system of claim 7, wherein, in programming data into the flash array, the flash controller utilizes incremental step pulse programming.

9. The information handling system of claim 8, wherein the second command register controls an initial programming voltage for the incremental step pulse programming.

10. The information handling system of claim 8, wherein the second command register controls a programming step voltage for the incremental step pulse programming.

11. A method, comprising:
programming, by a flash device interface of an information handling system, a first command register of a flash controller of a flash device of the information handling system with a first value, wherein the first command register controls a read threshold count value for reading data from a flash array of the flash device;
reading, by the flash device interface, a first status register of the flash controller; and
determining that a usage of the flash device is in accordance with one of a more read/write-intensive usage and a less read/write-intensive usage based upon a value in the first status register;
setting a mode register of the flash device interface to a first state and retaining the first value in the first command register when the usage is in accordance with the more read/write-intensive usage; and setting the mode register to a second state and reprogramming the first command register with a second value when the usage is in accordance with the less read/write-intensive usage, wherein the first command register controls a read threshold count value for reading data from the flash array, wherein the read threshold count value is associated with a number of voltage threshold levels provided for read operations of the flash controller.

12. The method of claim 11, wherein in further response to reading the first status register, the method comprises determining if a status value stored in the first status register is less than a threshold.

13. The method of claim 12, wherein the first status register indicates a number of read retries to the flash array.

14. The method of claim 13, wherein, when the number of read retries is less than the threshold, the second value is less than the first value.

15. The method of claim 13, wherein, when the number of read retries is not less than the threshold, the second value is greater than the first value.

16. The method of claim 11, wherein the first value is associated with higher reliability data reads from the flash array than the second value, and the second value is associated with higher performance data reads from the flash array than the first value.

17. The method of claim 11, further comprising:
programming, by the flash device interface, a second command register of the flash controller with a third value, wherein the second command register controls a programming value for programming data into the flash array
reading, by the flash device interface, a second status register of the flash controller; and
programming the second command register with a fourth value in response to reading the first status register.

18. The method of claim 17, wherein, in programming data into the flash array, the flash controller utilizes incremental step pulse programming.

19. The method of claim 18, wherein the second command register controls at least one of an initial programming voltage for the incremental step pulse programming, and a programming step voltage for the incremental step pulse programming.

20. An information handling system, comprising:
a flash device interface; and
a flash device including a flash controller and a flash array;
wherein the flash device interface sets a mode register of the flash device interface to a first state, programs a first command register of the flash controller with a first value, reads a first status register of the flash controller, and in response to reading the first status register, sets the mode register to a second state and programs the first command register with a second value, wherein the first command register controls a read threshold count value for reading data from the flash array, wherein the read threshold count value is associated with a number of voltage threshold levels provided for read operations of the flash controller.

* * * * *